United States Patent
Tseng

(10) Patent No.: US 8,849,074 B2
(45) Date of Patent: Sep. 30, 2014

(54) OPTICAL-ELECTRICAL CONVERTING DEVICE

(71) Applicant: Kuo-Fong Tseng, New Taipei (TW)

(72) Inventor: Kuo-Fong Tseng, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/651,645

(22) Filed: Oct. 15, 2012

(65) Prior Publication Data

US 2013/0287334 A1    Oct. 31, 2013

(30) Foreign Application Priority Data

Apr. 27, 2012   (TW) ................. 101115100 A

(51) Int. Cl.
*G02B 6/12* (2006.01)
*H05K 1/02* (2006.01)

(52) U.S. Cl.
CPC .............. *G02B 6/12* (2013.01); *H05K 1/0274* (2013.01)
USPC ...................................................... 385/14

(58) Field of Classification Search
CPC ........................... G02B 6/12; H05K 1/0274
USPC ............................................... 385/14
See application file for complete search history.

(56) References Cited

U.S. PATENT DOCUMENTS

| | | | | |
|---|---|---|---|---|
| 5,009,481 A * | 4/1991 | Kinoshita et al. | ............ | 385/33 |
| 5,170,448 A * | 12/1992 | Ackley et al. | ............ | 385/31 |
| 5,400,419 A * | 3/1995 | Heinen | ............ | 385/14 |
| 5,577,142 A * | 11/1996 | Mueller-Fiedler et al. | ..... | 385/47 |
| 5,600,741 A * | 2/1997 | Hauer et al. | ............ | 385/35 |
| 6,316,281 B1 * | 11/2001 | Lee et al. | ............ | 438/31 |
| 6,389,202 B1 * | 5/2002 | Delpiano et al. | ............ | 385/14 |
| 6,512,861 B2 * | 1/2003 | Chakravorty et al. | ........ | 385/14 |
| 6,640,021 B2 * | 10/2003 | Pogge et al. | ............ | 385/14 |
| 6,947,622 B2 * | 9/2005 | Wang et al. | ............ | 385/15 |
| 7,239,767 B2 * | 7/2007 | Kim et al. | ............ | 385/14 |
| 7,289,701 B2 * | 10/2007 | Lam et al. | ............ | 385/49 |
| 7,466,880 B2 * | 12/2008 | Windover | ............ | 385/14 |
| 7,766,559 B2 * | 8/2010 | Epitaux et al. | ............ | 385/89 |
| 7,801,397 B2 * | 9/2010 | Block et al. | ............ | 385/14 |
| 8,611,704 B2 * | 12/2013 | Yasuda et al. | ............ | 385/14 |
| 2003/0118288 A1 * | 6/2003 | Korenaga et al. | ............ | 385/49 |
| 2004/0033008 A1 * | 2/2004 | Mikawa et al. | ............ | 385/14 |
| 2004/0151462 A1 * | 8/2004 | Furuyama | ............ | 385/129 |
| 2004/0264838 A1 * | 12/2004 | Uchida et al. | ............ | 385/14 |
| 2005/0053319 A1 * | 3/2005 | Doan | ............ | 385/14 |
| 2005/0249462 A1 * | 11/2005 | Alduino et al. | ............ | 385/49 |
| 2010/0142886 A1 * | 6/2010 | Warashina et al. | ............ | 385/14 |
| 2010/0278485 A1 * | 11/2010 | Nakagawa et al. | ............ | 385/38 |

* cited by examiner

*Primary Examiner* — Charlie Peng
(74) *Attorney, Agent, or Firm* — Novak Druce Connolly Bove + Quigg LLP

(57) ABSTRACT

An optical-electrical converting device includes a first substrate, a planar waveguide, a bearing member, a reflective member, a second substrate, a laser beam emitting member, and a driving chip. The first substrate includes a supporting surface. The planar waveguide is supported on the supporting surface, and includes a laser beam incident surface. The bearing member is supported on the supporting surface, and includes a sloped surface aligned with the laser beam incident surface. The reflective member is positioned on the sloped surface. The second substrate is supported on both the bearing member and the planar waveguide. The second substrate comprising a lower surface and an upper surface. The laser beam emitting member is positioned on the lower surface, and includes a laser beam emitting surface aligned with the reflective member. The driving chip is positioned on the upper surface, and is electrically connected to the laser beam emitting member.

11 Claims, 1 Drawing Sheet

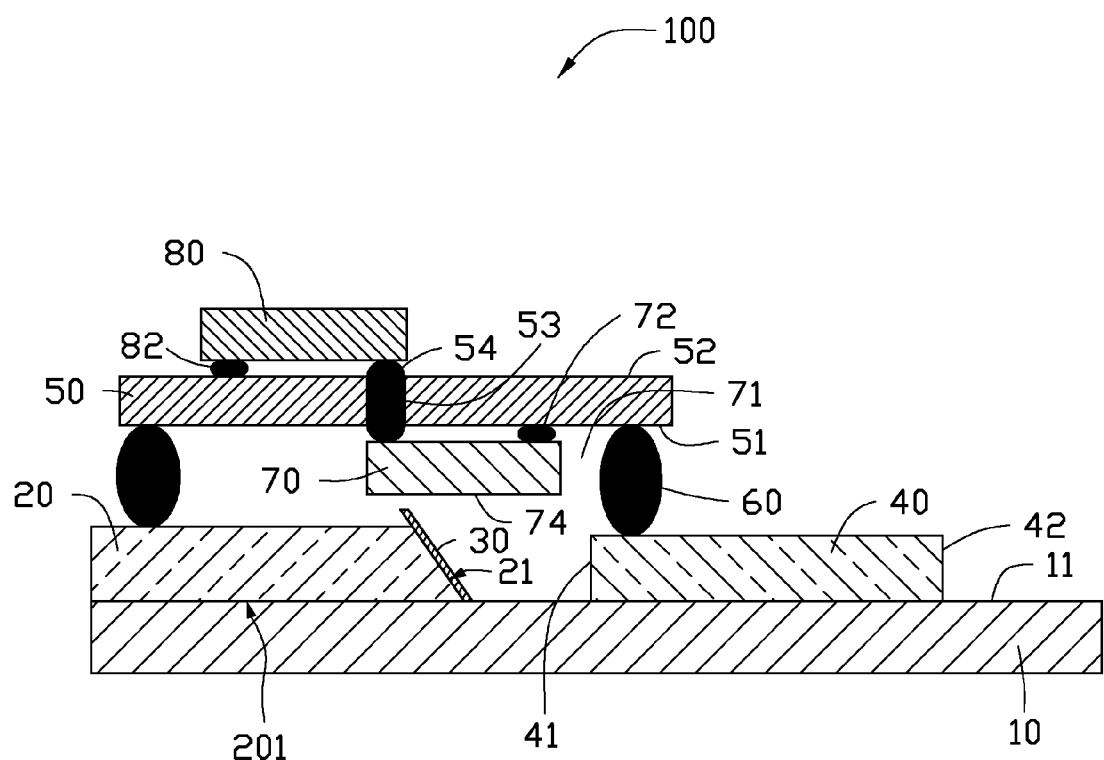

OPTICAL-ELECTRICAL CONVERTING DEVICE

BACKGROUND

1. Technical Field

The present disclosure relates to an optical-electrical converting device.

2. Description of Related Art

Optical-electrical converting devices may include a printed circuit board (PCB), a laser beam emitting module, a shell, and a number of coupling lenses. The laser beam emitting module and the shell are positioned on the PCB. The shell defines a number of receiving holes for receiving the coupling lenses. Each of the coupling lenses aligns with an optical fiber, for coupling laser beams into the optical fiber. The need for so many lenses and fibers is costly.

Therefore, it is desirable to provide an optical-electrical converting device that can overcome the above-mentioned limitations.

BRIEF DESCRIPTION OF THE DRAWINGS

Many aspects of the present disclosure can be better understood with reference to the following drawing. The components in the drawing are not necessarily drawn to scale, the emphasis instead being placed upon clearly illustrating the principles of the present disclosure.

The FIGURE is a schematic cross-section of an optical-electrical converting device, according to an exemplary embodiment.

DETAILED DESCRIPTION

The FIGURE illustrates an optical-electrical converting device 100. The optical-electrical converting device 100 includes a first substrate 10, a bearing member 20, a reflective member 30, a planar waveguide 40, a second substrate 50, a number of supporting members 60, a laser beam emitting member 70, and a driving chip 80.

The first substrate 10 is made of silicon, and includes a supporting surface 11. Both the bearing member 20 and the planar waveguide 40 are supported on the supporting surface 11. The planar waveguide 40 aligns with the bearing member 20.

The bearing member 20 includes a bottom surface 201 contacted with the supporting surface 11 and a sloped surface 21 optically aligned with the planar waveguide 40. A range of an angle between the sloped surface 21 and the bottom surface 201 is from 120 degrees to 150 degrees.

The reflective member 30 is made of ferronickel alloy. The reflective member 30 is positioned on the sloped surface 21.

The planar waveguide 40 includes a laser beam incident surface 41 aligning with the sloped surface 21 and the reflective member 30, and a laser beam exit surface 42 facing away from the laser beam incident surface 41.

The second substrate 50 is made of copper. The second substrate 50 is supported on the bearing member 20 and the planar waveguide 40 by the supporting members 60 positioned between the bearing member 20 and the second substrate 50 and positioned between the planar waveguide 40 and the second substrate 50. The second substrate 50 includes a lower surface 51 opposite to both the bearing member 20 and the planar waveguide 40, and an upper surface 52 facing away from the lower surface 51. In the embodiment, the supporting members 60 are solder balls, and there are two supporting members 60. The supporting members 60 are attached on the lower surface 51. The supporting members 60 have essentially identical height. One of the supporting members 60 is supported on the bearing member 20, while the other supporting member 60 is supported on the planar waveguide 40. The second substrate 50 defines a through hole 53 at its center. The through hole 53 passes through the upper surface 52 and the lower surface 51. The two supporting members 60 are substantially symmetrical with each other about the through hole 53. A first bonding ball 54 is extended through the through hole 53.

The laser beam emitting member 70 is shorter than the supporting members 60 in the direction perpendicular to the upper surface 52. The laser beam emitting member 70 is received in a receiving room 71 cooperatively formed by the second substrate 50, the first substrate 10, the bearing member 20, the supporting members 60, and the planar waveguide 40. In particular, the laser beam emitting member 70 is positioned on the lower surface 51 of the second substrate 50 and electrically connected to the second substrate 50 through a second bonding ball 72 sandwiched between the second substrate 50 and the laser beam emitting member 70. The laser beam emitting member 70 includes a laser beam emitting surface 74 aligned with the reflective member 30.

The driving chip 80 is positioned on the upper surface 52 of the second substrate 50 and electrically connected to the second substrate 50 through a third bonding ball 82 sandwiched between the second substrate 50 and the driving chip 80. One end of the first bonding ball 54 is electrically connected to the driving chip 80, while the other end of the first bonding ball 54 is electrically connected to the laser beam emitting member 70. As such, the laser beam emitting member 70 is electrically connected to the driving chip 80 by the second bonding ball 54.

In use, the driving chip 80 drives the laser beam emitting member 70 to emit laser beams to the reflective member 30, which are then reflected to the laser beam incident surface 41, finally, the planner waveguide 40 emits the laser beams through the laser beam exit surface 42.

It will be understood that the above particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. An optical-electrical converting device, comprising:
   a first substrate comprising a supporting surface;
   a planar waveguide supported on the supporting surface, and comprising a laser beam incident surface;
   a bearing member supported on the supporting surface, and comprising a sloped surface aligned with the laser beam incident surface;
   a reflective member positioned on the sloped surface, the reflective member being made of ferronickel alloy;
   a second substrate supported on both the bearing member and the planar waveguide, the second substrate comprising a lower surface opposite to both the bearing member and the planar waveguide and an upper surface facing away from the lower surface;
   a laser beam emitting member positioned on the lower surface, and comprising a laser beam emitting surface optically aligned with the reflective member; and
   a driving chip positioned on the upper surface, and electrically connected to the laser beam emitting member.

2. The optical-electrical converting device of claim 1, wherein the first substrate is made of silicon.

3. The optical-electrical converting device of claim 1, wherein the bearing member comprises a bottom surface contacted with the supporting surface, a range of an angle between the sloped surface and the supporting surface is from 120 degrees to 150 degrees.

4. The optical-electrical converting device of claim 1, wherein the planar waveguide comprises a laser beam exit surface facing away from the laser beam incident surface.

5. The optical-electrical converting device of claim 1, wherein the second substrate is made of copper.

6. The optical-electrical converting device of claim 1, wherein the second substrate is supported on the bearing member and the planar waveguide by a plurality of supporting members.

7. The optical-electrical converting device of claim 6, wherein the supporting members are solder balls, and the number of the supporting members is two, the two supporting members are attached on the lower surface of the second substrate, the supporting members have essentially identical height, one of the supporting members is supported on the bearing member, while the other supporting member is supported on the planar waveguide.

8. The optical-electrical converting device of claim 6, wherein the laser beam emitting member is shorter that the supporting members in a direction perpendicular to the upper surface, the laser beam emitting member is received in a receiving room cooperatively formed by the second substrate, the first substrate, the bearing members, the supporting members, and the planar waveguide.

9. The optical-electrical converting device of claim 1, wherein the second substrate defines a through hole at its center, the through hole passes through the upper surface and the lower surface, the optical-electrical converting device comprises a first bonding ball extending through the through hole, one end of the first bonding ball is electrically connected to the driving chip, while the other end of the first bonding ball is electrically connected to the laser beam emitting member, the laser beam emitting member is electrically connected to the driving chip by the first bonding ball.

10. The optical-electrical converting device of claim 1, wherein the laser beam emitting member is electrically connected to the second substrate through a second bonding ball sandwiched between the second substrate and the laser beam emitting member.

11. The optical-electrical converting device of claim 1, wherein the driving chip is electrically connected to the second substrate through a third bonding ball sandwiched between the second substrate and the driving chip.

* * * * *